(12) United States Patent
Tsuda

(10) Patent No.: US 10,680,625 B2
(45) Date of Patent: Jun. 9, 2020

(54) TRANSMISSION DEVICE AND CONTROL METHOD

(71) Applicants: Kabushiki Kaisha Toshiba, Minato-ku, Tokyo (JP); Toshiba Electronic Devices & Storage Corporation, Minato-ku, Tokyo (JP)

(72) Inventor: Yuki Tsuda, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/552,041

(22) Filed: Aug. 27, 2019

(65) Prior Publication Data

US 2019/0386667 A1    Dec. 19, 2019

Related U.S. Application Data

(63) Continuation of application No. 16/125,915, filed on Sep. 10, 2018, now Pat. No. 10,439,622.

(30) Foreign Application Priority Data

Jan. 26, 2018   (JP) .................. 2018-011700

(51) Int. Cl.
   *H03L 7/099* (2006.01)
   *H03L 7/093* (2006.01)
   *H03F 3/24* (2006.01)
   *H03F 3/20* (2006.01)
   *H03F 3/189* (2006.01)

(52) U.S. Cl.
   CPC ............ *H03L 7/0991* (2013.01); *H03F 3/24* (2013.01); *H03L 7/093* (2013.01); *H03F 3/189* (2013.01); *H03F 3/20* (2013.01); *H03F 2200/451* (2013.01); *H03L 2207/50* (2013.01)

(58) Field of Classification Search
   None
   See application file for complete search history.

(56) References Cited

U.S. PATENT DOCUMENTS

| 8,031,008 | B2 | 10/2011 | Wang et al. |
| 8,331,520 | B2 | 12/2012 | Ueda et al. |
| 8,598,929 | B1 | 12/2013 | Wicpalek et al. |
| 8,633,746 | B2 | 1/2014 | Norimatsu et al. |
| 8,890,592 | B2 | 11/2014 | Nonis et al. |
| 8,929,502 | B2 | 1/2015 | Endo et al. |
| 2013/0093479 | A1 | 4/2013 | Norimatsu et al. |

FOREIGN PATENT DOCUMENTS

| JP | 2011-23804 A | 2/2011 |
| JP | 2013-51569 A | 3/2013 |
| JP | 2013-90132 A | 5/2013 |
| WO | 2017-150241 A1 | 9/2017 |

*Primary Examiner* — Jeffery S Zweizig
(74) *Attorney, Agent, or Firm* — White & Case LLP

(57) ABSTRACT

According to one embodiment, there is provided a transmission device including a digital PLL and a power amplifier. The power amplifier is connected to the digital PLL. The digital PLL includes a digital oscillator and a controller. The controller operates the digital oscillator with a first loop bandwidth in a first period corresponding to startup of the power amplifier, operates the digital oscillator with a second loop bandwidth narrower than the first loop bandwidth in a second period being after the first period, and operates the digital oscillator with a third loop bandwidth narrower than the second loop bandwidth in a third period being after the second period.

20 Claims, 6 Drawing Sheets

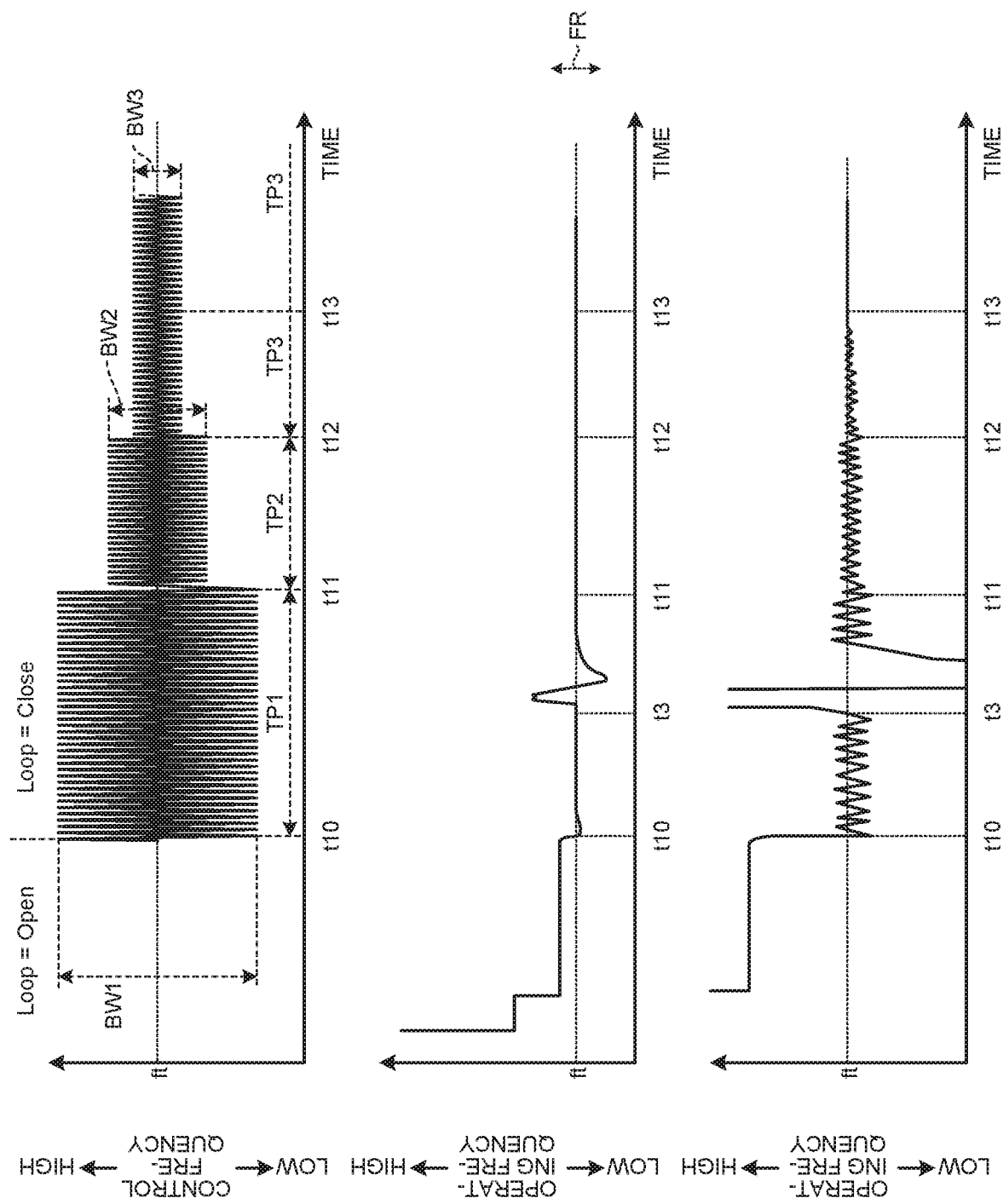

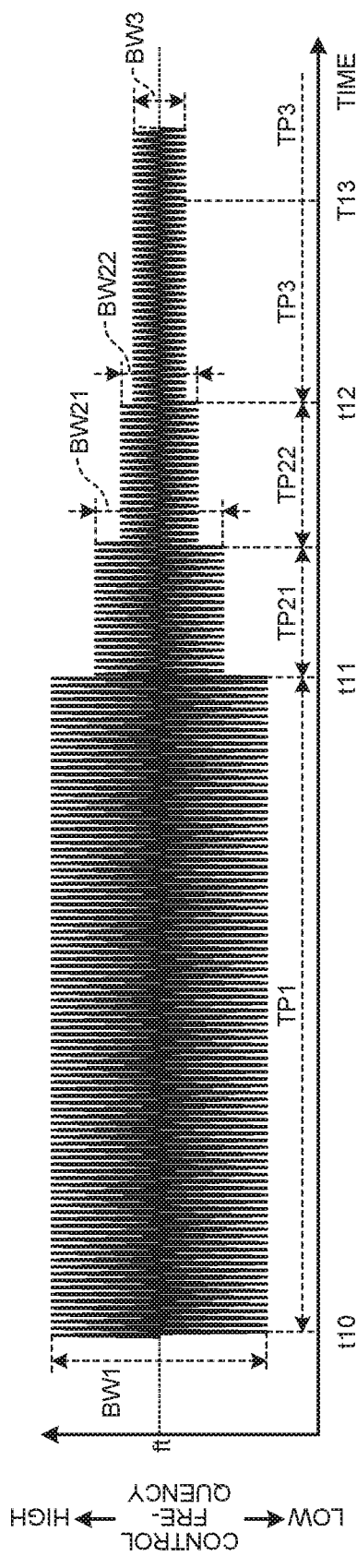
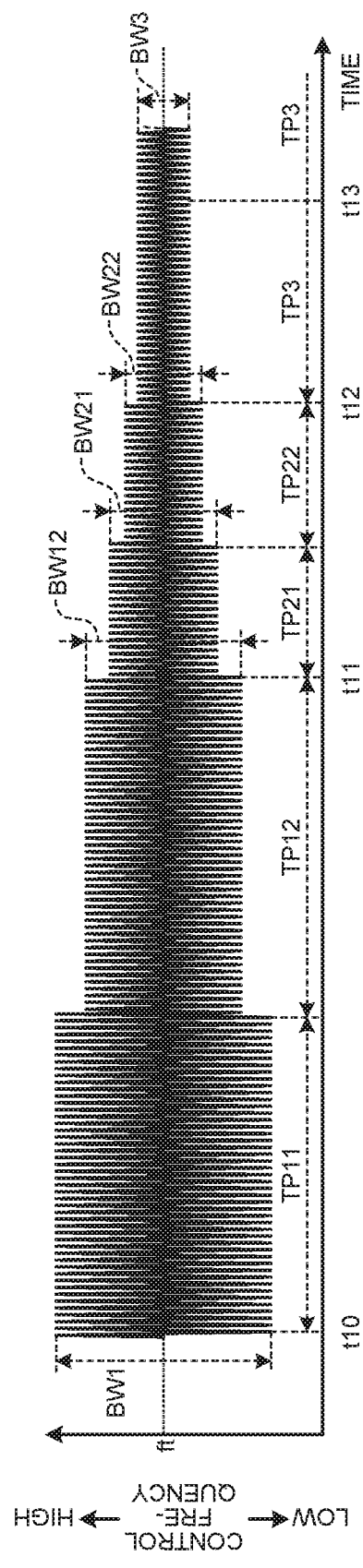

TRANSMISSION DEVICE AND CONTROL METHOD

CROSS-REFERENCE TO RELATED APPLICATIONS

This application is a continuation of application Ser. No. 16/125,915 filed on Sep. 10, 2018 and is based upon and claims the benefit of priority from Japanese Patent Application No. 2018-011700, filed on Jan. 26, 2018; the entire contents of which are incorporated herein by reference.

FIELD

Embodiments described herein relate generally to a transmission device and a control method.

BACKGROUND

A digital PLL such as an ADPLL (All Digital PLL) adjusts an oscillation frequency thereof and changes to a locked state when the oscillation frequency reaches a target frequency. At this time, it is desired to reduce a lock-up time before the digital PLL changes to the locked state.

BRIEF DESCRIPTION OF THE DRAWINGS

FIGS. 5A to 5C are diagrams showing control of a loop bandwidth and temporal fluctuation in an operating frequency of a DCO in the embodiment.

FIGS. 6A and 6B are diagrams showing control of a loop bandwidth in a modification of the embodiment.

DETAILED DESCRIPTION

Figure 1:
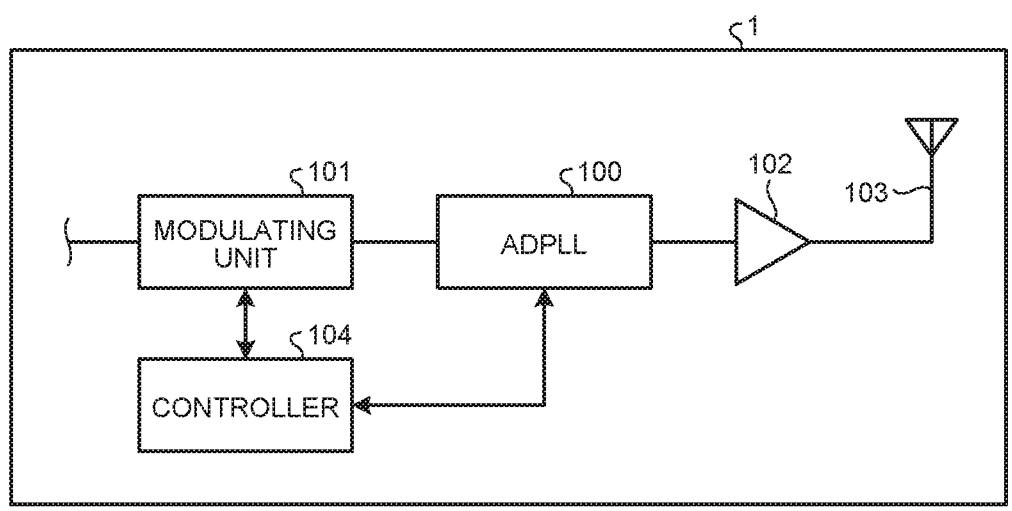
FIG. 1 is a diagram showing the configuration of a transmission device according to an embodiment.

In general, according to one embodiment, there is provided a transmission device including a digital PLL and a power amplifier. The power amplifier is connected to the digital PLL. The digital PLL includes a digital oscillator and a controller. The controller operates the digital oscillator with a first loop bandwidth in a first period corresponding to startup of the power amplifier, operates the digital oscillator with a second loop bandwidth narrower than the first loop bandwidth in a second period being after the first period, and operates the digital oscillator with a third loop bandwidth narrower than the second loop bandwidth in a third period being after the second period.

Exemplary embodiments of a transmission device will be explained below in detail with reference to the accompanying drawings. The present invention is not limited to the following embodiments.

Embodiment

The transmission device according to the embodiment can be applied to a wireless communication device such as a wireless LAN device. The transmission device applied to the wireless communication device modulates a local signal in a modulation scheme such as GFSK (Gaussian Filtered Frequency Shift Keying) using a baseband signal (modulated data) modulated by transmission data and generates a transmission signal. The transmission device power-amplifies the generated transmission signal with a power amplifier and causes an antenna to radiate the transmission signal as a radio wave.

At this time, the transmission device causes the local signal to oscillate with a PLL circuit and generates the local signal. If the PLL circuit is configured by an analog circuit, when a reference frequency is low or when low-frequency resolution of an oscillation frequency is requested, a large loop filter is necessary to prevent unnecessary radiation such as spurious. A chip area of the PLL circuit tends to increase. If the PLL circuit is configured by the analog circuit, the PLL circuit is often operated by current control. Power consumption of the PLL circuit tends to increase.

On the other hand, if the PLL circuit is configured by a digital circuit, the PLL circuit can be formed by a CMOS process. Because refining of the PLL circuit is easy, the chip area of the PLL circuit is easily reduced. If the PLL circuit is configured by the digital circuit, the PLL circuit can be operated mainly by voltage control. The power consumption of the PLL circuit is easily reduced.

For example, development of a PLL (Phase-Locked Loop) circuit to be adapted to extended specifications of Bluetooth (registered trademark) called BLE (Bluetooth Low Energy) has been in progress. The BLE is a specification for performing communication with ultra-low power. A reduction in power consumption is required. If the PLL circuit is configured by an ADPLL (All Digital PLL), a phase comparator and an oscillator are also configured by digital circuits. Therefore, space saving and power saving are easy.

In compliance to the standard of Bluetooth 5.0, because output power of a power amplifier is large, a frequency fluctuation amount of the ADPLL due to startup of the power amplifier tends to be large. For example, when a target frequency of the ADPLL is set to a relatively high-frequency side in a passband of a filter in the ADPLL, the influence of the setting of the target frequency can be reduced by setting a loop bandwidth during startup waiting of the power amplifier to a wider band. During communication, phase noise can be effectively reduced by switching the setting of the loop bandwidth to narrowband setting.

On the other hand, according to a communication standard such as Bluetooth 5.0, before timing when a predetermined time elapses after the startup of the power amplifier, the transmission device is likely to be requested to change to a state in which the transmission device can start transmission of data. In this case, it is desired to reduce a lockup time before the digital PLL such as the ADPLL changes to a locked state to a predetermined time or less.

However, when a difference in the loop bandwidth increases between the wideband and the narrowband in the setting of the loop bandwidth, an operating frequency of the ADPLL greatly fluctuates immediately after the wideband setting is changed to the narrowband setting. Convergence to the locked state tends to take time. There is possibility that the operating frequency does not stabilize during a transmission start and a transmission error occurs.

Therefore, in this embodiment, the transmission device switches the loop bandwidth from the wideband setting to the narrowband setting stepwise to achieve a reduction in a lockup time while achieving both of a reduction in frequency fluctuation before transmission and a reduction in phase noise during transmission.

Specifically, a transmission device 1 can be configured as shown in FIG. 1. FIG. 1 is a diagram showing the configuration of the transmission device 1.

The transmission device 1 includes an ADPLL (a digital PLL) 100, a modulating unit 101, a power amplifier 102, an antenna 103, and a controller 104.

The controller 104 integrally controls the units of the transmission device 1. For example, the controller 104 performs monitoring and/or control on the ADPLL 100 and performs monitoring and/or control on the modulating unit 101. The controller 104 can control startup and stop of the ADPLL 100 and/or the modulating unit 101. The startup and the stop can include startup and stop involved in power supply and power shutdown from the outside and can include startup and stop involved in transition between an operation state and a pause state for a reduction of power consumption.

The modulating unit 101 receives a baseband signal (modulated data) from a data processing unit (not shown in the figure) such as a DSP (Digital Signal Processor). The modulating unit 101 smooths the baseband signal (the modulated data) using a filter having a Gaussian characteristic. The modulating unit 101 generates, according to a modulation scheme such as GFSK (Gaussian filtered Frequency Shift Keying) or GMSK (Gaussian filtered Minimum Shift Keying), a modulation signal including a value of a center frequency (a carrier frequency) of a local signal and a value of an offset frequency corresponding to a change in the modulated data and outputs the modulation signal to the ADPLL 100.

The ADPLL 100 is, for example, an offset PLL. The ADPLL 100 receives the modulation signal from the modulating unit 101 and performs frequency conversion using the modulation signal. That is, while causing the local signal to oscillate at a predetermined target frequency, the ADPLL 100 offsets a frequency of the local signal from the target frequency according to the modulation signal and applies modulation (frequency modulation) to the local signal to generate a transmission signal (an RF signal). The ADPLL 100 outputs the transmission signal (the RF signal) to the power amplifier 102. The ADPLL 100 adjusts a frequency of the transmission signal (the RF signal) on the basis of a feedback signal from an output node of the ADPLL 100.

The power amplifier 102 receives the transmission signal (the RF signal) from the ADPLL 100. The power amplifier 102 power-amplifies the transmission signal (the RF signal) and outputs the transmission signal (the RF signal) to the antenna 103.

The antenna 103 receives the power-amplified transmission signal (RF signal) from the power amplifier 102. The antenna 103 generates and radiates a radio wave corresponding to the transmission signal (the RF signal).

Figure 2:
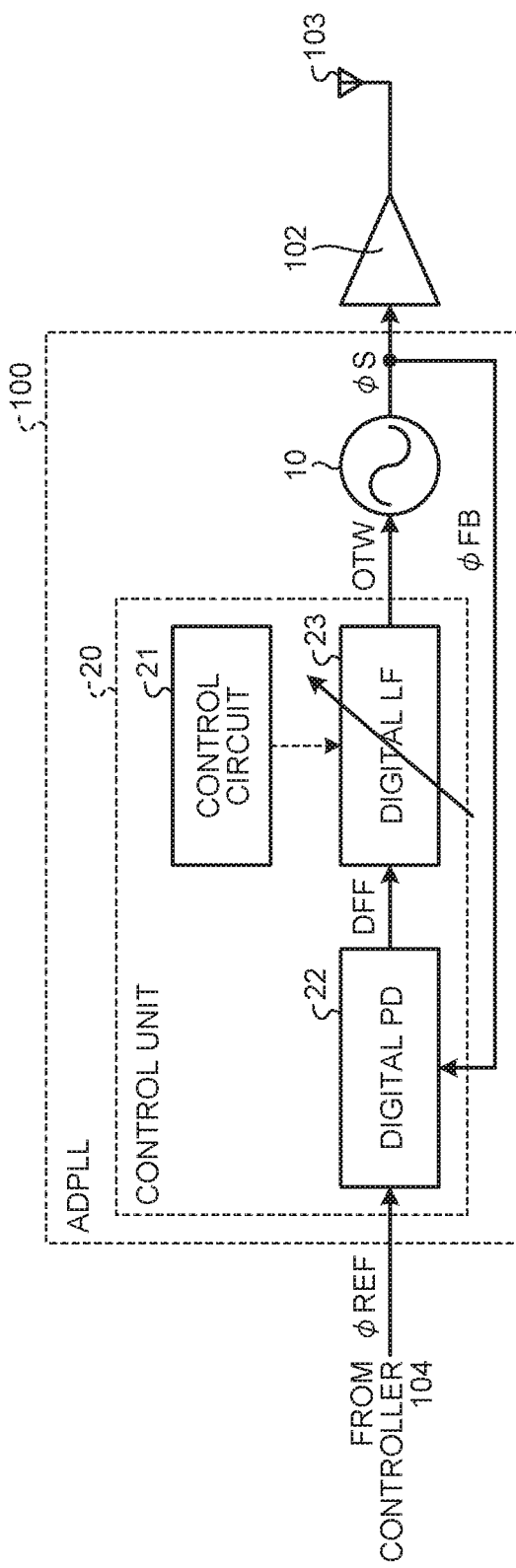
FIG. 2 is a diagram showing the configuration of an ADPLL in the embodiment.

In the transmission device 1, the ADPLL circuit 100 performs the adjustment of the frequency of the transmission signal (the RF signal) in an all-digital manner. Specifically, the ADPLL circuit 100 can be configured as shown in FIG. 2. FIG. 2 is a diagram showing the configuration of the ADPLL circuit 100.

The ADPLL circuit 100 includes a DCO (Digitally Controlled Oscillator) 10 and a control unit 20. The control unit 20 includes a control circuit 21, a digital PD (Phase Detector) 22, and a digital LF (Loop Filter) 23. The control circuit 21 can be configured by a digital circuit and can supply a control signal (a digital signal) to the units (e.g., the digital LF 23).

The digital PD 22 detects a phase difference between a feedback signal $\phi FB$ of a transmission signal $\phi S$ output from the DCO (a digital oscillator) 10 and a reference signal $\phi REF$ received from the controller 104 and outputs phase error data DFF corresponding to the phase difference to the digital LF 23.

Figure 3:
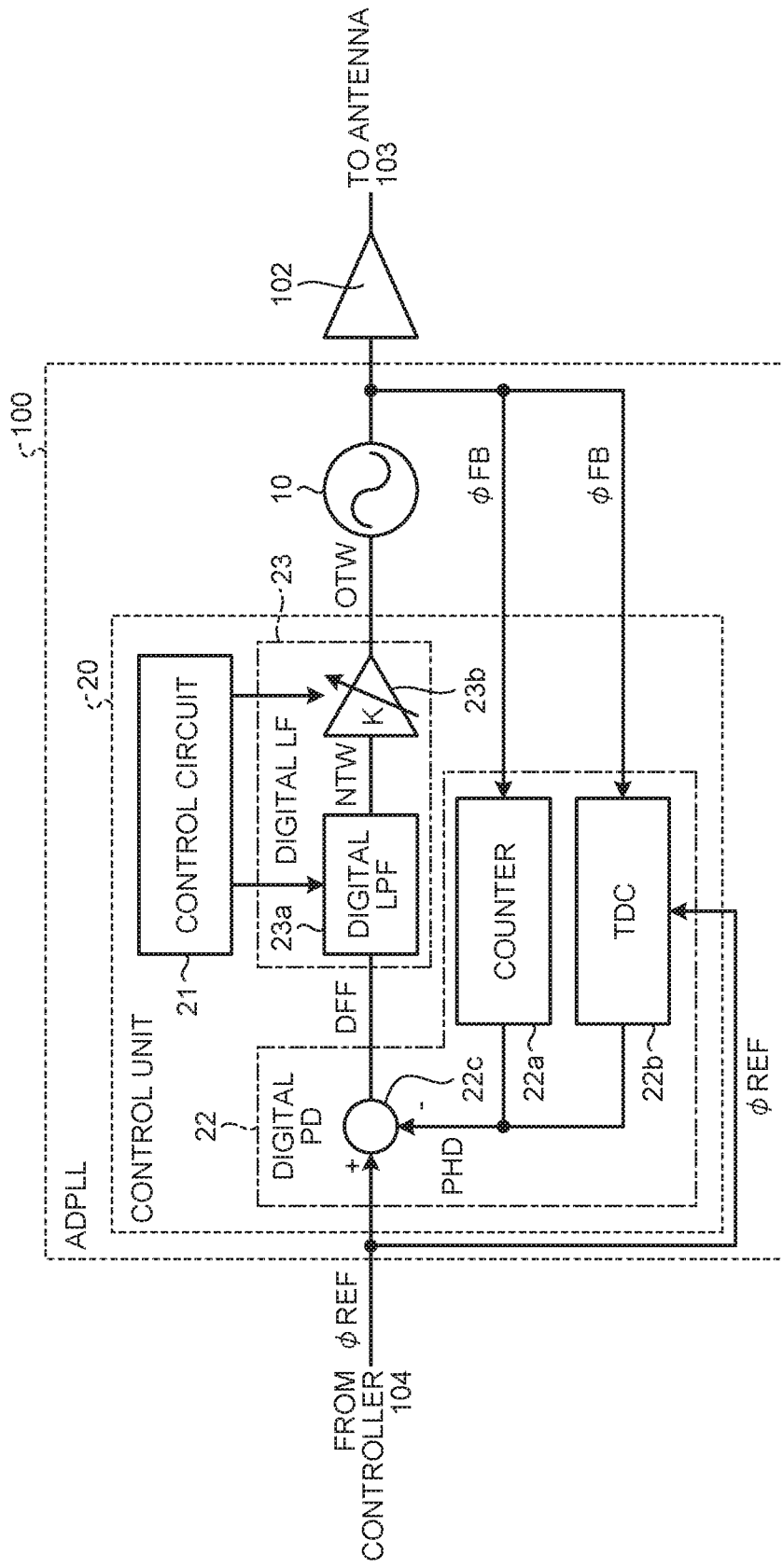
FIG. 3 is a diagram showing the configurations of a digital PD and a digital LF in the embodiment.

For example, the digital PD 22 can be configured as shown in FIG. 3. FIG. 3 is a diagram showing the configurations of the digital PD 22 and the digital LF 23. The digital PD 22 includes a counter 22a, a TDC (Time to Digital Converter) 22b, and a subtractor 22c. The counter 22a cumulatively integrates a frequency of the feedback signal $\phi FB$ and outputs phase information PHD, which is a result of the integration, to the subtractor 22c on the basis of a timing signal. The TDC 22b extracts, at higher resolution, a difference between phases of two inputs of the reference signal $\phi REF$ and the feedback signal $\phi FB$ and generates the phase information PHD indicating an error equivalent to one cycle or less of the feedback signal $\phi FB$. The TDC 22b outputs the phase information PHD (the phase information PHD for supplementing the phase information PHD from the counter 22a) to the subtractor 22c on the basis of a reference signal. The subtractor 22c receives the reference signal $\phi REF$ from the controller 104 and receives the phase information PHD from the counter 22a and the TDC 22b. The subtractor 22c subtracts the phase information PHD from the reference signal $\phi REF$ to generate phase error data DFF and outputs the phase error data DFF to the digital LF 23.

The digital LF 23 shown in FIG. 2 receives the phase error data DFF from the digital PD 22. The digital LF 23 applies filtering processing to the phase error data DFF and applies amplification processing to the phase error data DFF, generates an oscillator tuning word OTW, and outputs the oscillator tuning word OTW to the DCO 10.

For example, the digital LF 23 can be configured as shown in FIG. 3. The digital LF 23 includes a digital LPF (Low Pass Filter) 23a and a multiplier 23b. The digital LPF 23a filters and smooths, according to a filter coefficient, a high-frequency component of the phase error data DFF output from the subtractor 22c and outputs the high-frequency component to the multiplier 23b as a standardized oscillator control value NTW (Normalized Tuning Word). The digital LPF 23a can be configured as an IIR (Infinite Impulse Response) filter or an FIR (Finite Impulse Response) filter. The multiplier 23b receives the oscillator control value NTW from the digital LPF 23a. The multiplier 23b multiplies the oscillator control value NTW by a coefficient K to generate the oscillator tuning word OTW and outputs the oscillator tuning word OTW to the DCO 10.

At this time, the control circuit 21 is capable of controlling the digital LPF 23a and/or the multiplier 23b to change a filter coefficient of the digital LPF 23a and/or a coefficient K of the multiplier 23b. Consequently, the control circuit 21 is capable of changing a filter bandwidth of the digital LF 23 and capable of changing a loop bandwidth of the ADPLL 100. For example, the control circuit 21 can increase the loop bandwidth by widening a passband of the digital LPF 23a (increasing a cutoff frequency of the digital LPF 23a) and increasing the coefficient K of the multiplier 23b. The control circuit 21 can reduce the loop bandwidth by narrowing the passband of the digital LPF 23a (reducing the cutoff frequency of the digital LPF 23a) and reducing the coefficient K of the multiplier 23b.

For example, the control circuit 21 operates the DCO 10 with a loop bandwidth LBW=BW1 in a period TP1. The period TP1 is a period corresponding to startup of the power amplifier 102. The control circuit 21 can perform at least one of the widening of the passband of the digital LPF 23a (the increase of the cutoff frequency of the digital LPF 23*a*) and the increase of the coefficient K of the multiplier 23*b* at start timing of the period TP1 and set the loop bandwidth to LBW=BW1. The control circuit 21 can maintain the passband of the digital LPF 23*a* and the coefficient K of the multiplier 23*b* from the start timing to end timing of the period TP1.

The control circuit 21 operates the DCO 10 with a loop bandwidth LBW=BW2 in a period TP2. The period TP2 is a period following the period TP1. The loop bandwidth LBW=BW2 is a loop bandwidth narrower than the loop bandwidth LBW=BW1. The control circuit 21 can perform at least one of the narrowing of the passband of the digital LPF 23*a* (the reduction of the cutoff frequency of the digital LPF 23*a*) and the reduction of the coefficient K of the multiplier 23*b* at start timing of the period TP2 and reduce the loop bandwidth from LBW=BW1 to LBW=BW2. The control circuit 21 can maintain the passband of the digital LPF 23*a* and the coefficient K of the multiplier 23*b* from the start timing to end timing of the period TP2.

The control circuit 21 operates the DCO 10 with a loop bandwidth LBW=BW3 in a period TP3. The period TP3 is a period following the period TP2. The loop bandwidth LBW=BW3 is a loop bandwidth narrower than the loop bandwidth LBW=BW2. The control circuit 21 can perform at least one of the narrowing of the passband of the digital LPF 23*a* (the reduction of the cutoff frequency of the digital LPF 23*a*) and the reduction of the coefficient K of the multiplier 23*b* at start timing of the period TP3 and reduce the loop bandwidth from LBW=BW2 to LBW=BW3. The control circuit 21 can maintain the passband of the digital LPF 23*a* and the coefficient K of the multiplier 23*b* from the start timing to end timing of the period TP3.

Note that the length of the period TP1 can be experimentally determined in advance as a time in which fluctuation in an operating frequency of the DCO 10 can converge in a frequency range corresponding to the loop bandwidth LBW=BW2 when the loop bandwidth is controlled to LBW=BW1. The length of the period TP2 can be experimentally determined in advance as a time in which fluctuation in the operating frequency of the DCO 10 can converge in a frequency range corresponding to the loop bandwidth LBW=BW3 when the loop bandwidth is controlled to LBW=BW2. The start timing of the period TP3 can be experimentally determined in advance as timing when a time in which fluctuation in the operating frequency of the DCO 10 can converge in an allowable range can be secured before transmission start timing when the loop bandwidth is controlled to LBW=BW3.

The DCO 10 is an oscillator capable of discretely controlling an oscillation frequency with the oscillator control word OTW. The DCO 10 generates the transmission signal (an RF signal) φS corresponding to the oscillator control word OTW. The DCO 10 is implemented by, for example, performing binary control of a plurality of capacitors. The DCO 10 outputs the transmission signal (the RF signal) φS to the power amplifier 102.

Figure 4:
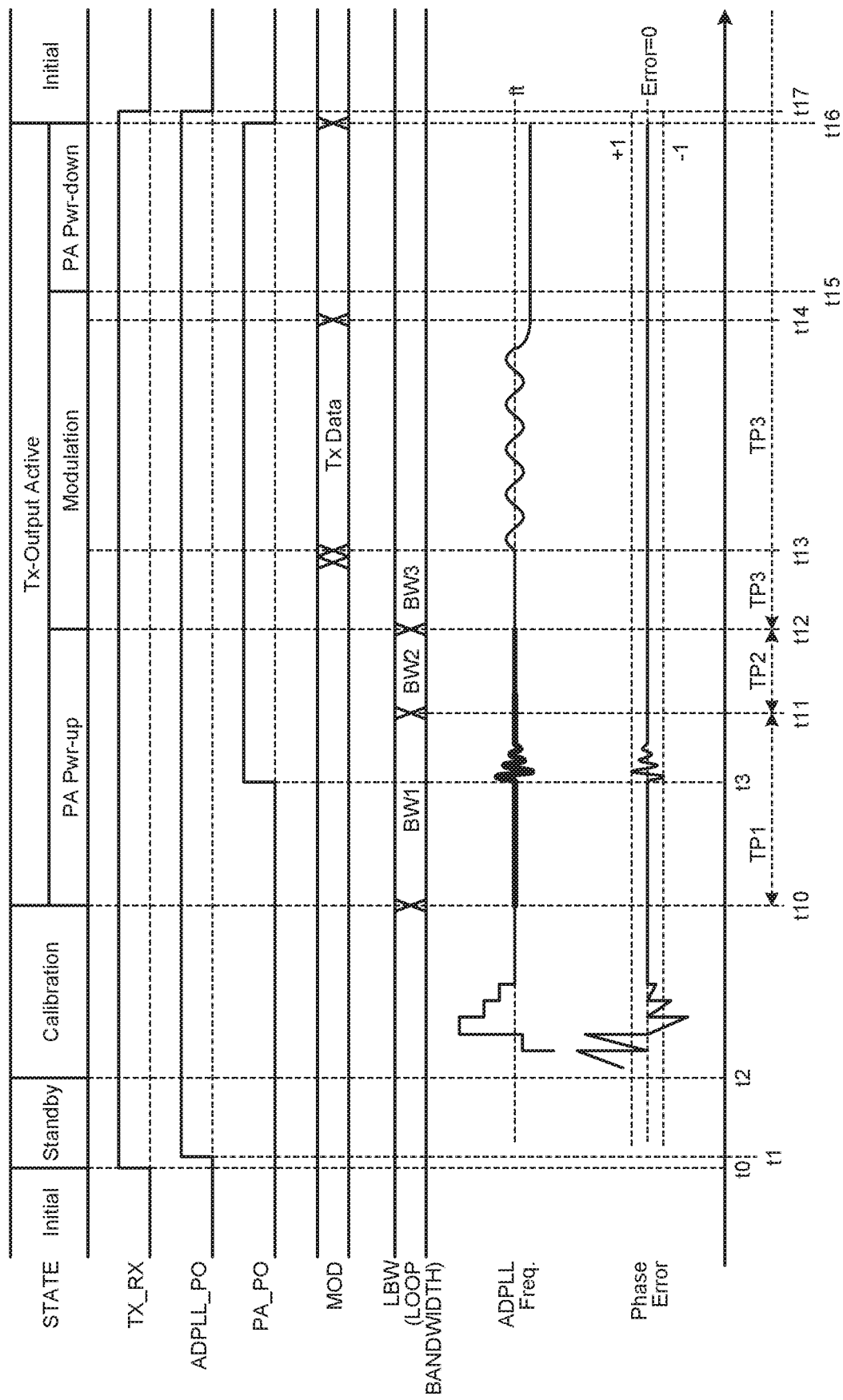
FIG. 4 is a timing chart showing the operation of the transmission device according to the embodiment.

The operation of the transmission device 1 is explained with reference to FIG. 4. FIG. 4 is a timing chart showing the operation of the transmission device 1. In the following explanation, operation performed when a target frequency ft of the ADPLL 100 is set to a relatively high-frequency side in the passband of the digital LPF 23*a* is illustratively explained.

In the ADPLL 100 of the transmission device 1, the control circuit 21 is configured as a state machine and manages state information STATE shown in FIG. 4. The control circuit 21 is capable of changing content of the state information STATE on the basis of at least one of a control signal received from the controller 104 and a result of monitoring of the units in the ADPLL 100.

Before timing t0, the control circuit 21 sets the state information STATE="Initial" and, according to the state information STATE="Initial", recognizes that the units in the ADPLL 100 are in an initial state.

At timing t0, when receiving, from the controller 104, a control signal indicating that transmission is possible, the control circuit 21 sets a transmission control signal TX_RX to an active level (e.g., an H level) and changes the state information from STATE="Initial" to STATE="Standby".

According to the state information STATE="Standby", at timing t1 when the predetermined time elapses from the timing t0, the control circuit 21 sets a startup control signal ADPLL_PO of the ADPLL 100 to the active level (e.g., the H level) and supplies the startup control signal ADPLL_PO to the units in the ADPLL 100. According to the supply of the startup control signal ADPLL_PO, electric power is supplied to the units excluding the power amplifier 102 in the ADPLL 100 from a power supply circuit (not shown in the figure).

When receiving notifications of startup completion of a main power supply from the units, at timing t2, the control circuit 21 change the state information from STATE="Standby" to STATE="Calibration" and instructs the units in the ADPLL 100 to perform a calibration operation. In the calibration operation, the ADPLL 100 roughly adjusts an oscillation frequency of the DCO 10 to approach a control frequency set by the oscillator tuning word OTW.

When receiving notifications of calibration operation completion from the units, at timing t10, the control circuit 21 changes the state information from STATE="Calibration" to STATE="TX-Output Active"+"PA Pwr-up" and sets the loop bandwidth of the ADPLL 100 to LBW=BW1 (wideband setting). Consequently, a loop in the ADPLL 100 changes from an open state to a close state.

As shown in FIG. 5A, the loop bandwidth LBW=BW1 includes the target frequency ft of the DCO 10 and is wider than the loop bandwidth LBW=BW2 and wider than the loop bandwidth LBW=BW3. The loop bandwidth LBW=BW1 can be set to width of a band including the loop bandwidth LBW=BW2 and including the loop bandwidth LBW=BW3. The loop bandwidth LBW=BW1 can be set to width of a band having widths of approximately (BW1)/2 respectively above and below the target frequency ft. FIG. 5A is a diagram showing control of the loop bandwidth LBW. As shown in FIG. 5B and FIG. 5C, as the loop in the ADPLL 100 changes from the open state to the close state, a jump occurs in a frequency (ADPLL Freq.) of the transmission signal φS output from the ADPLL 100 and the frequency starts to fluctuate. FIG. 5C shows temporal fluctuation in the operating frequency of the DCO 10 on a vertical axis on which a frequency range FR indicated by a broken line arrow in FIG. 5B is enlarged.

According to the state information STATE="TX-Output Active"+"PA Pwr-up", at timing t3 when the predetermined time elapses from timing t10, the control circuit 21 sets the startup control signal PA_PO of the power amplifier 102 to the active level (e.g., the H level) and supplies the startup control signal PA_PO to the power amplifier 102.

According to the supply of the startup control signal PA_PO, when electric power is supplied to the power amplifier 102 from the power supply circuit (not shown in the figure), as shown in FIG. 5B and FIG. 5C, the frequency (ADPLL Freq.) of the transmission signal φS output from the ADPLL 100 greatly fluctuates.

At this time, because the loop bandwidth is LBW=BW1 (the wideband setting), the frequency fluctuation of the transmission signal φS can be reduced to a certain degree. That is, in the loop bandwidth LBW=BW1 (the wideband setting), the control frequency of the DCO 10 can be changed with a characteristic close to the fluctuation in the operating frequency of the DCO 10 compared with LBW=BW2 (intermediate band setting) and LBW=BW3 (narrowband setting). It is easy to cause the operating frequency of the DCO 10 to follow the control frequency of the DCO 10. Consequently, in the loop bandwidth LBW=BW1 (the wideband setting), the operating frequency of the DCO 10 can be kept in a predetermined range (e.g., a frequency range corresponding to LBW=BW2) in a shorter time compared with LBW=BW2 (the intermediate band setting) and LBW=BW3 (the narrowband setting).

At timing t11 when the period TP1 elapses from timing t10, the control circuit 21 changes the loop bandwidth from LBW=BW (the wideband setting) to LBW=BW2 (intermediate band setting).

As shown in FIG. 5A, the loop bandwidth LBW=BW2 includes the target frequency ft of the DCO 10 and is narrower than the loop bandwidth LBW=BW1 and wider than the loop bandwidth LBW=BW3. The loop bandwidth LBW=BW2 can be set to width of a band included in the loop bandwidth LBW=BW1 and including the loop bandwidth LBW=BW3. The loop bandwidth can be determined as LBW=BW2=(BW1+BW3)/2. The loop bandwidth LBW=BW2 can be set to width of a band having widths of approximately (BW2)/2 respectively above and below the target frequency ft.

At this time, because the loop bandwidth is changed from LBW=BW1 to LBW=BW2, compared with when the loop bandwidth is changed from LBW=BW1 to LBW=BW3, a gap of the loop bandwidth during the change can be reduced. Fluctuation in the operating frequency of the DCO 10 involved in the gap of the loop bandwidth during the change can be reduced.

If the fluctuation in the operating frequency of the DCO 10 is reduced to a degree of a frequency range corresponding to LBW=BW2 as shown in FIG. 5B in the period TP1, the control frequency of the DCO 10 can be changed with a characteristic close to the fluctuation in the operating frequency of the DCO 10. It is easy to cause the operating frequency of the DOO 10 to follow the control frequency of the DCO 10.

At timing t12 when the period TP2 elapses from timing t11, the control circuit 21 changes the loop bandwidth from LBW=BW2 (the intermediate band setting) to LBW=BW3 (the narrowband setting).

As shown in FIG. 5A, the loop bandwidth LBW=BW3 includes the target frequency ft of the DCO 10 and is narrower than the loop bandwidth LBW=BW1 and narrower than the loop bandwidth LBW=BW2. The loop bandwidth LBW=BW3 can be set to width of a band included in the loop bandwidth LBW=BW1 and included in the loop bandwidth LBW-BW2. The loop bandwidth LBW=BW3 can be set to width of a band having widths of approximately (BW3)/2 respectively above and below the target frequency ft.

At this time, because the loop bandwidth is changed from LBW=BW2 to LBW=BW3, compared with when the loop bandwidth is changed from LBW=BW1 to LBW=BW3, a gap of the loop bandwidth during the change can be reduced.

Fluctuation in the operating frequency of the DCO 10 involved in the gap of the loop bandwidth during the change can be reduced.

If the fluctuation in the operating frequency of the DCO 10 is reduced to a degree of a frequency band corresponding to LBW=BW3 as shown in FIG. 5B in the period TP2, the control frequency of the DCO 10 can be changed with a characteristic close to the fluctuation in the operating frequency of the DCO 10. It is easy to cause the operating frequency of the DCO 10 to follow the control frequency of the DCO 10.

At timing (e.g., timing t12) when the predetermined period elapses from timing t10, the control circuit 21 changes the state information from STATE="TX-Output Active"+"PA Pwr-up" to STATE="TX-Output Active"+"Modulation" and instructs the units in the ADPLL 100 to perform preparation of a transmitting operation.

When receiving notifications of preparation completion of the transmitting operation from the units, at timing t13, the control circuit 21 controls the units in the ADPLL 100 to perform the transmitting operation. That is, the control circuit 21 controls the units of the ADPLL 100 to start input of a modulation signal (TxData) from the modulating unit 101 to the ADPLL 100 and start a frequency converting operation by the ADPLL 100 performed using the modulation signal.

At this time, if the fluctuation in the operating frequency of the DCO 10 is kept within an allowable range because the loop bandwidth LBW is reduced stepwise in such a manner as BW1→BW2→BW3, the ADPLL 100 can start the transmitting operation without causing a transmission error.

In the loop bandwidth LBW=BW3 (the narrowband setting), compared with LBW=BW1 (the wideband setting) and LBW=BW2 (the intermediate band setting), phase noise (Phase Error) of the transmission signal φS can be effectively reduced. Deterioration in a spectrum characteristic of the transmission signal φS can be prevented.

At timing t14, when the input of the modulation signal (TxData) from the modulating unit 101 ends, at timing t15 after timing t14, the control circuit 21 changes the state information from STATE="TX-Output Active"+"Modulation" to STATE="TX-Output Active"+"PA Pwr-down".

According to the state information STATE="TX-Output Active"+"PA Pwr-down", at timing t16 when the predetermined time elapses from the timing t15, the control circuit 21 sets the startup control signal PA_PO of the power amplifier 102 to a nonactive level (e.g., an L level) and supplies the startup control signal PA_PO to the power amplifier 102. According to the supply of the startup control signal PA_PO, the power supply to the power amplifier 102 from the power supply circuit (not shown in the figure) is shut down. The control circuit 21 changes the state information from STATE="TX-Output Active"+"PA Pwr-down" to STATE="Initial".

According to the state information STATE="Initial", at timing t17 when the predetermined time elapses from timing t16, the control circuit 21 sets the transmission control signal TX_RX to the nonactive level (e.g., the L level) and sets the startup control signal ADPLL_PO of the ADPLL 100 to the nonactive level (e.g., the L level) and supplies the transmission control signal TX_RX and the startup control signal ADPLL_PO to the units in the ADPLL 100. According to the supply of the transmission control signal TX_RX and the startup control signal ADPLL_PO, the power supply to the units excluding the power amplifier 102 in the ADPLL 100 from the power supply circuit is shut down.

As explained above, in the embodiment, the transmission device 1 switches the loop bandwidth LBW of the ADPLL 100 from the wideband setting to the narrowband setting stepwise (e.g., in two stages). Consequently, frequency fluctuation involved in the switching of the loop bandwidth LBW of the ADPLL 100 can be reduced. A convergence time to the locked state of the ADPLL 100 can be reduced. That is, it is possible to reduce the lockup time of the ADPLL 100 while achieving both of a reduction in frequency fluctuation before transmission and a reduction in phase noise during transmission.

Note that the transmission device 1 can switch the loop bandwidth LBW of the ADPLL 100 from the wideband setting to the narrowband setting in multiple stages.

For example, as shown in FIG. 6A, when the period TP2 of the intermediate band setting is divided into a period TP21 and a period TP22, the control circuit 21 can operate the DCO 10 with a loop bandwidth LBW=BW21 in the period TP21 and operate the DCO 10 with a loop bandwidth LBW=BW22 in the period TP22. At this time, a size relation of the loop bandwidths can be set to a relation indicated by the following Expression 1.

$$BW1 > BW21 > BW22 > BW3 \qquad \text{Expression 1}$$

At this time, the length of the period TP21 can be experimentally determined in advance as a time in which fluctuation in the operating frequency of the DCO 10 can converge in a frequency range corresponding to the loop bandwidth LBW=BW22 when the loop bandwidth is controlled to LBW=BW21. The length of the period TP22 can be experimentally determined in advance as a time in which fluctuation in the operating frequency of the DCO 10 can converge in a frequency range corresponding to the loop bandwidth LBW=BW3 when the loop bandwidth is controlled to LBW=BW22.

For example, as shown in FIG. 6B, when the period TP1 of the wideband setting is divided into a period TP11 and a period TP12, the control circuit 21 can operate the DCO 10 with the loop bandwidth LBW=BW1 in the period TP11 and operate the DCO 10 with a loop bandwidth LBW=BW12 in the period TP12. At this time, a size relation of the loop bandwidths can be set to a relation indicated by the following Expression 2.

$$BW1 > BW12 > BW21 > BW22 > BW3 \qquad \text{Expression 2}$$

At this time, the length of the period TP11 can be experimentally determined as a time in which fluctuation in the operating frequency of the DCO 10 can converge in a frequency range corresponding to the loop bandwidth LBW=BW12 when the loop bandwidth is controlled to LBW=BW1. The length of the period TP12 can be experimentally determined in advance as a time in which fluctuation in the operating frequency of the DCO 10 can converge in a frequency range corresponding to the loop bandwidth LBW=BW21 when the loop bandwidth is controlled to LBW=BW12.

In addition, although the embodiment exemplifies a case of applying the ADPLL 100 to the transmission device, the ADPLL 100 can be applied to other device that is needed to achieve a reduction in a lockup time while achieving both of a reduction in frequency fluctuation before transmission and a reduction in phase noise during transmission.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transmission device comprising:
   a digital PLL; and
   a power amplifier connected to the digital PLL, wherein the digital PLL includes:
      a digital oscillator; and
      a controller that operates the digital oscillator with a first loop bandwidth in a first period, operates the digital oscillator with a second loop bandwidth narrower than the first loop bandwidth in a second period being after the first period, and operates the digital oscillator with a third loop bandwidth narrower than the second loop bandwidth in a third period being after the second period.

2. The transmission device according to claim 1, wherein the first period is a period starting from a timing, the timing being a timing to which a predetermined time elapsed from startup of the power amplifier.

3. The transmission device according to claim 2, wherein the controller operates the digital oscillator with a fourth loop bandwidth narrower than the third loop bandwidth in a fourth period being after the third period.

4. The transmission device according to claim 2, wherein
   the second loop bandwidth is included in the first loop bandwidth,
   the third loop bandwidth is included in the second loop bandwidth, and
   a target frequency of the digital oscillator is included in the third loop bandwidth.

5. The transmission device according to claim 3, wherein
   the second loop bandwidth is included in the first loop bandwidth,
   the third loop bandwidth is included in the second loop bandwidth,
   the fourth loop bandwidth is included in the third loop bandwidth, and
   a target frequency of the digital oscillator is included in the fourth loop bandwidth.

6. The transmission device according to claim 2, wherein the controller includes:
   a digital PD;
   a digital LF disposed between the digital PD and the digital oscillator; and
   a control circuit that controls the digital LF to operate the digital oscillator with the first loop bandwidth in the first period, operate the digital oscillator with the second loop bandwidth in the second period, and operate the digital oscillator with the third loop bandwidth in the third period.

7. The transmission device according to claim 6, wherein the digital LF includes:
   a digital LPF disposed on an output side of the digital PD; and
   a multiplier disposed on an output side of the digital LPF.

8. The transmission device according to claim 7, wherein the control circuit controls a filter bandwidth of the digital LPF to operate the digital oscillator with the first loop bandwidth in the first period, operate the digital oscillator with the second loop bandwidth in the second period, and operate the digital oscillator with the third loop bandwidth in the third period.

9. The transmission device according to claim 7, wherein the control circuit controls a coefficient of the multiplier to operate the digital oscillator with the first loop bandwidth in the first period, operate the digital oscillator with the second loop bandwidth in the second period, and operate the digital oscillator with the third loop bandwidth in the third period.

10. The transmission device according to claim 7, wherein the control circuit controls a filter bandwidth of the digital LPF and a coefficient of the multiplier to operate the digital oscillator with the first loop bandwidth in the first period, operate the digital oscillator with the second loop bandwidth in the second period, and operate the digital oscillator with the third loop bandwidth in the third period.

11. The transmission device according to claim 7, wherein the control circuit controls the digital LPF to operate the digital LPF with a first filter bandwidth in the first period, operate the digital LPF with a second filter bandwidth narrower than the first filter bandwidth in the second period, and operate the digital LPF with a third filter bandwidth narrower than the second filter bandwidth in the third period.

12. The transmission device according to claim 7, wherein the control circuit controls the multiplier to operate the multiplier with a first coefficient in the first period, operate the multiplier with a second coefficient smaller than the first coefficient in the second period, and operate the multiplier with a third coefficient smaller than the second coefficient in the third period.

13. The transmission device according to claim 7, wherein the control circuit controls the digital LPF and the multiplier to operate the digital LPF with a first filter bandwidth and operate the multiplier with a first coefficient in the first period, operate the digital LPF with a second filter bandwidth narrower than the first filter bandwidth and operate the multiplier with a second coefficient smaller than the first coefficient in the second period, and operate the digital LPF with a third filter bandwidth narrower than the second filter bandwidth and operate the multiplier with a third coefficient smaller than the second coefficient in the third period.

14. The transmission device according to claim 2, wherein the control circuit, after instructing a calibration operation, starts the first period in response to receiving notifications of calibration operation completion.

15. A control method for a transmission device including a digital PLL including a digital oscillator and a power amplifier connected to an output side of the digital PLL, the control method comprising:

operating the digital oscillator with a first loop bandwidth;
operating the digital oscillator with a second loop bandwidth narrower than the first loop bandwidth after operating the digital oscillator with the first loop bandwidth; and
operating the digital oscillator with a third loop bandwidth narrower than the second loop bandwidth after operating the digital oscillator with the second loop bandwidth.

16. The control method according to claim 15, wherein the operating the digital oscillator with a first loop bandwidth starts from a timing, the timing being a timing to which a predetermined time elapsed from startup of the power amplifier.

17. The control method according to claim 16, further comprising
operating the digital oscillator with a fourth loop bandwidth narrower than the third loop bandwidth after operating the digital oscillator with the third loop bandwidth.

18. The control method according to claim 16, wherein the second loop bandwidth is included in the first loop bandwidth,
the third loop bandwidth is included in the second loop bandwidth, and
a target frequency of the digital oscillator is included in the third loop bandwidth.

19. The control method according to claim 17, wherein the second loop bandwidth is included in the first loop bandwidth,
the third loop bandwidth is included in the second loop bandwidth,
the fourth loop bandwidth is included in the third loop bandwidth, and
a target frequency of the digital oscillator is included in the fourth loop bandwidth.

20. The control method according to claim 16, wherein the operating the digital oscillator with the first loop bandwidth includes operating a digital LPF included in the digital PLL with a first filter bandwidth,
the operating the digital oscillator with the second loop bandwidth includes operating the digital LPF with a second filter bandwidth narrower than the first filter bandwidth, and
the operating the digital oscillator with the third loop bandwidth includes operating the digital LPF with a third filter bandwidth narrower than the second filter bandwidth.

* * * * *